US 6,597,084 B2

(12) United States Patent
Hu et al.

(10) Patent No.: US 6,597,084 B2
(45) Date of Patent: Jul. 22, 2003

(54) RING-SHAPED PIEZOELECTRIC TRANSFORMER HAVING AN INNER AND OUTER ELECTRODE

(75) Inventors: Jin-Hua Hu, Shatin (HK); Hing-Leung Li, Kowloon (HK); Helan Lai-Wah Chan, Hong Kong (HK); Chung-Loong Choy, Shatin (HK)

(73) Assignee: The Hong Kong Polytechnic University, Kowloon (HK)

( * ) Notice: Subject to any disclaimer, the term of this patent is extended or adjusted under 35 U.S.C. 154(b) by 0 days.

(21) Appl. No.: 09/754,399

(22) Filed: Jan. 5, 2001

(65) Prior Publication Data

US 2002/0130592 A1 Sep. 19, 2002

(51) Int. Cl.⁷ .................. H01L 41/04; H01L 41/18; H01L 41/08; H02M 2/00
(52) U.S. Cl. .................. 310/357; 310/366; 310/359; 310/369; 310/358
(58) Field of Search .................. 310/369, 357, 310/359, 358, 366

(56) References Cited

U.S. PATENT DOCUMENTS

| | | | | |
|---|---|---|---|---|
| 3,858,065 A | * | 12/1974 | Epstein .................. 310/9.5 |
| 4,530,138 A | * | 7/1985 | Ritter .................. 156/285 |
| 4,598,592 A | * | 7/1986 | McMaster .................. 72/786 |
| 5,200,617 A | * | 4/1993 | Hayes et al. .................. 250/306 |
| 5,278,471 A | * | 1/1994 | Uehara et al. .................. 310/328 |
| 5,471,721 A | * | 12/1995 | Haertling .................. 29/25.35 |
| 5,594,292 A | * | 1/1997 | Takeuchi et al. .................. 310/324 |
| 5,604,392 A | * | 2/1997 | Vig .................. 310/309 |
| 5,814,922 A | * | 9/1998 | Uchino et al. .................. 310/359 |
| 5,861,702 A | * | 1/1999 | Bishop et al. .................. 310/317 |
| 5,948,996 A | * | 9/1999 | Takeuchi et al. .................. 73/504.03 |
| 5,991,239 A | * | 11/1999 | Fatemi-Booshehri et al. .................. 367/164 |
| 6,040,654 A | * | 3/2000 | Le Letty .................. 310/358 |
| 6,111,818 A | * | 8/2000 | Bowen et al. .................. 367/140 |
| 6,127,771 A | * | 10/2000 | Boyd et al. .................. 310/352 |
| 6,140,747 A | * | 10/2000 | Saito et al. .................. 310/328 |
| 6,157,129 A | * | 12/2000 | Rausenberger et al. .................. 313/161 |
| 6,190,497 B1 | * | 2/2001 | Chan et al. .................. 156/580.1 |
| 6,208,065 B1 | * | 3/2001 | Ueyama .................. 310/328 |
| 6,239,558 B1 | * | 5/2001 | Fujimura et al. .................. 310/318 |

FOREIGN PATENT DOCUMENTS

JP          1087525 A2 *  3/2001

* cited by examiner

Primary Examiner—Nestor Ramirez
Assistant Examiner—Julio C. Gonzalez R.
(74) Attorney, Agent, or Firm—Jacobson Holman PLLC

(57) ABSTRACT

Piezoelectric transformers have a number of favorable characteristics over traditional electromagnetic tranformers. However, the construction of piezoelectric transformers tends to be complicated, which may result in increasing manufacturing cost. Furthermore, such complex constructions may raise difficulties in the miniaturization of such devices. A ring-shaped piezoelectric transformer is developed in this invention for low voltage applications. One surface of the transformer is covered by two disc or ring-shaped electrodes separated by a ring-shaped separating segment, and the regions covered by the disc or ring-shaped electrodes served as the input and output parts of the transformer. This transformer may be fabricated relatively easily due to its simple structure. Furthermore, its size and thickness may be reduced relatively easily without increasing the difficulty of the fabricating process. The transformer may be used separately or in parallel.

7 Claims, 10 Drawing Sheets

$r_o$ = outer radius
$r_i$ = inner radius

Third symmetric extensional mode

Radial direction ←

FIG. 6(b)

Displacement nodal points

Radial direction ←

FIG. 7(a)

Fourth symmetric extensional mode

FIG. 7(b)

Fifth symmetric extensional mode

FIG. 7(c)

Sixth symmetric extensional mode

FIG. 7(d)

Seventh symmetric extensional mode

⇨ Direction of motion

——— stress
------ displacement

RING-SHAPED PIEZOELECTRIC TRANSFORMER HAVING AN INNER AND OUTER ELECTRODE

FIELD OF THE INVENTION

This invention relates to piezoelectric transformers generally in the shape of a ring.

BACKGROUND OF THE INVENTION

Piezoelectric transformers are devices that step-up or step-down AC voltage or current by piezoelectric vibration. Such transformers have several advantages over electromagnetic tranformers. First, it has a lager power to volume ratio such that it is easier to be miniaturised. Second, piezoelectric transformers use electromagnetic-noise free as piezoelectric vibration is involved instead of an electromagnetic field. Further, since such transformers have no windings the hazard of overheating and/or fire may be substantially reduced.

In general, piezoelectric transformers may be classified into two types. One type is being used as step-up transformers in which the voltage gain is larger than one. Another type is used as step-down transformers with voltage gain of less than one. A single plate structure is usually adopted in the step-up piezoelectric transformers, while a multi-layered structure is usually adopted in the step down transformers.

Figure 1:
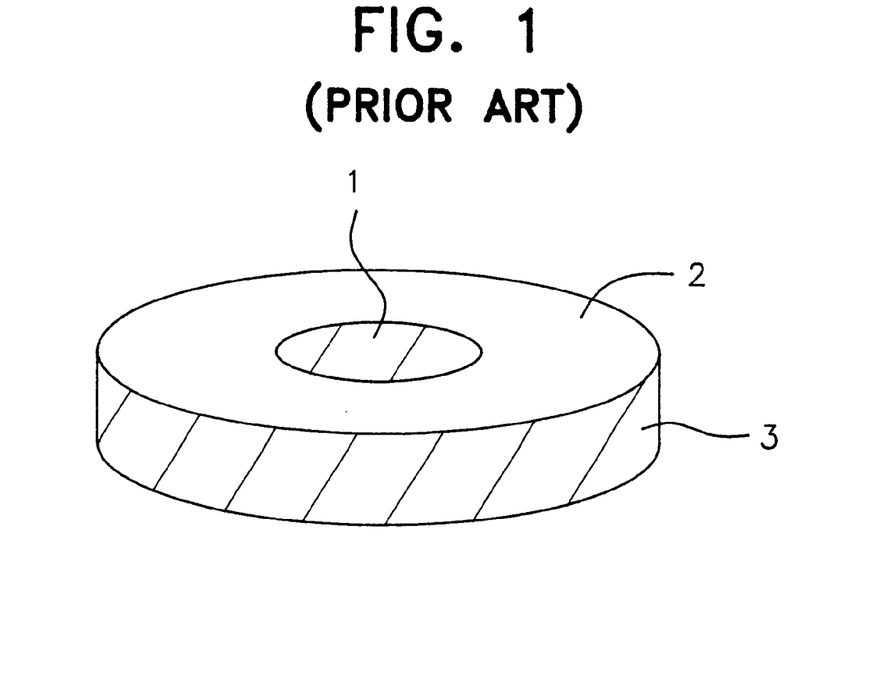
FIG. 1 show a perspective view of a prior art piezoelectric transformer utilizing both lateral and longitudinal poling.

In U.S. Pat. No. 2,974,296, a variety of piezoelectric transformers having a general shape of a disc were disclosed. FIG. 1 is a reproduction of an embodiment shown in U.S. Pat. No. '296. In this particular embodiment, input signal is supplied to electrode 1 and a common electrode on the bottom surface (not shown in the figure), while the output signal is taken between electrode 3 and the common electrode.

Figure 2:
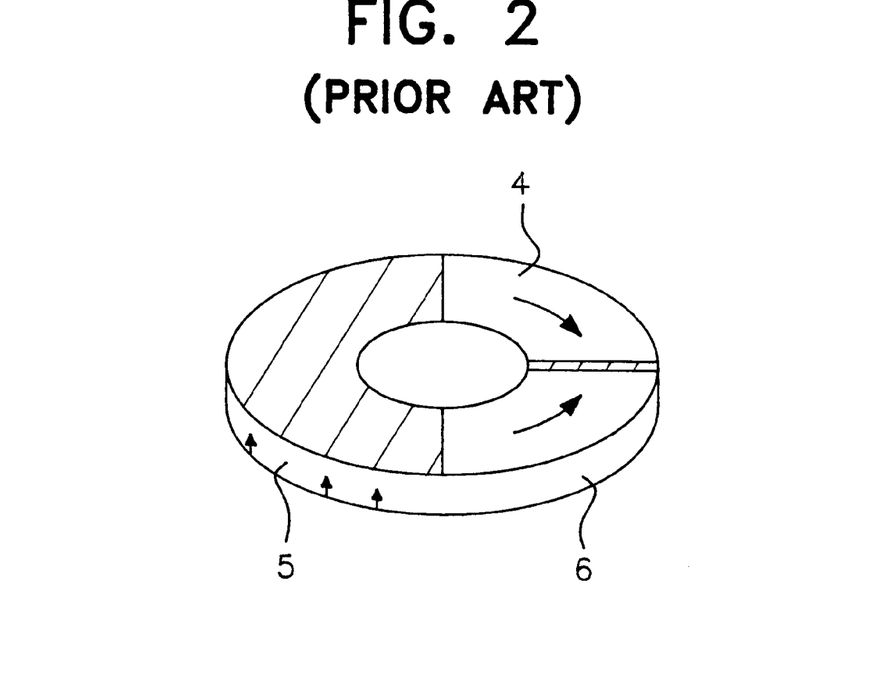
FIG. 2 is a perspective view of prior art piezoelectric transformer having semi-circular input and output electrodes.

FIG. 2 shows yet another version of a piezoelectric transformer described in U.S. Pat. No. '296. In this particular embodiment, the piezoelectric body 4 is divided into two semi-circular regions. In driving region 5, the piezoelectric body 4 is polarised across the thickness of the body. Accordingly, the output region 6 is polarised in opposing tangential directions as shown in FIG. 2. When an input signal is supplied to the input electrode associated with the output region 5, vibration results in the change of radius and circumference of the piezoelectric body 4. The variation in circumference results in strains and corresponding output signals in output region 6.

The piezoelectric transformers as described in U.S. Pat. No. '296 having a general shape of a disc way have the drawback of being relatively difficult to manufacture as the piezoelectric body includes several portions which are required to be polarized differently.

U.S. Pat. Nos. 5,814,922 and 6,040,654 describe piezoelectric transformers having a general ring-shaped piezoelectric body. One possible disadvantage associated with these transformers may be that they are relatively difficult to fabricate due to their complex structures. In U.S. Pat. No. 5,814,922, a piezoelectric transformer with its body being divided into at least eight sections is described. In U.S. Pat. No. 6,040,654, a piezoelectric transformer having at least eight different sections is described, with each section being connected by relatively delicate connection rods. The difficulty to manufacture may become more apparent if their size is substantially reduced.

Therefore, it is an object of this invention to provide a piezoelectric transformer having a relatively simple structure that may be fabricated easily. It is yet another object of this invention to provide a piezoelectric transformer that may be miniaturised readily.

As a minimum, it is an object of the present invention to provide the public with a useful choice.

SUMMARY OF THE INVENTION

Accordingly, this invention provides a piezoelectric transformer including a substantially ring-shaped piezoelectric material having first and second surfaces separated by a thickness dimension defining a thickness direction. The first surface is at least partially covered by a common electrode, while, the second surface includes first and second segments each at least partially covered by corresponding first and second electrodes. The first and second electrodes are separated electrically by a substantially ring-shaped separating section. Under such a construction, when an input signal is applied to the first electrode, a vibration is excited along a radial direction that is substantially perpendicular to the thickness direction, and a stress is developed across the radial direction, resulting in an output signal generated at the second electrode.

Additionally, the separating section is located at a position where the stress is zero. More preferably, the separating section has a radius substantially equal to the average value of the inner and outer radii of the piezoelectric material.

Optionally the first and second electrodes are in contact with conducting elements for applying or sensing signals to the first and second electrodes, that the conducting elements are in contact at nodal points of the vibration. More preferably, the nodal points of displacement of the first and second segments are substantially in the middle of the corresponding first and second segments.

Preferably, the piezoelectric transformer operates in third symmetric extensional vibration mode having a resonance frequency. More preferably, the input signal has a frequency substantially equals to the resonance frequency of the third symmetric extensional vibration mode.

Optionally, the piezoelectric transformer may operate in the either one of fourth to seventh symmetric extensional vibration mode.

Preferably, the first and second segments each are fully covered by corresponding first and second electrodes.

It is another aspect of this invention to provide a piezoelectric transformer including a substantially ring-shaped piezoelectric material having first and second surfaces separated by a thickness dimension defining a thickness direction, wherein the first surface is at least partially covered by a common electrode;

the second surface includes first and second segments each at least partially covered by corresponding first and second electrodes, such that when an input signal is applied to the first electrode, a vibration is excited along a radial direction that is perpendicular to the thickness direction, and a stress is developed across the radial direction, resulting in an output signal generated at the second electrode; and a substantially ring-shaped separating section electrically separating the first and second electrodes locating at a position where the stress is zero.

It is a further aspect of this invention to provide a piezoelectric transformer including a substantially ring-shaped piezoelectric material having first and second surfaces separated by a thickness dimension defining a thickness direction, wherein the first surface is at least partially covered by a common electrode;

the second surface includes first and second segments each at least partially covered by corresponding first and second electrodes, such that when an input signal is applied to the first electrode, a vibration is excited along a radial direction that is perpendicular to the thickness direction, and a stress is developed across the radial direction, resulting in an output signal generated at the second electrode; and a substantially ring-shaped separating section electrically separating the first and second electrodes wherein the first and second electrodes are in contact with conducting elements for applying or sensing signals to the first and second electrodes, such that the conducting elements are in contact at nodal points of the vibration.

It is yet another aspect of this invention to provide a system for generating an output signal from an input signal including at least two piezoelectric transformers connected in parallel, wherein each piezoelectric transformer includes a substantially ring-shaped piezoelectric material having a first and second surfaces separated by a thickness dimension defining a thickness direction, wherein the first is at least partially covered by a common electrode;

the second surface includes first and second segments each at least partially covered by corresponding first and second electrodes; and a substantially ring-shaped separating section electrically separating the first and second electrodes such that when an input signal is applied to the first electrode, a vibration is excited along a radial direction that is perpendicular to the thickness direction, and a stress is developed across the radial direction, resulting in an output signal generated at the second electrode.

BRIEF DESCRIPTION OF THE DRAWINGS

Preferred embodiments of this invention will now be described with reference to the following figures:

FIG. 4 is the cross sectional view of the piezoelectric transformer of. FIGS. 3(a) and 3(b)

DESCRIPTION OF THE INVENTION

Preferred embodiment of this invention are now described with reference to the figures. List 1 is a part list so that the reference numerals in the figures may be easily referred to.

Figure 3A:
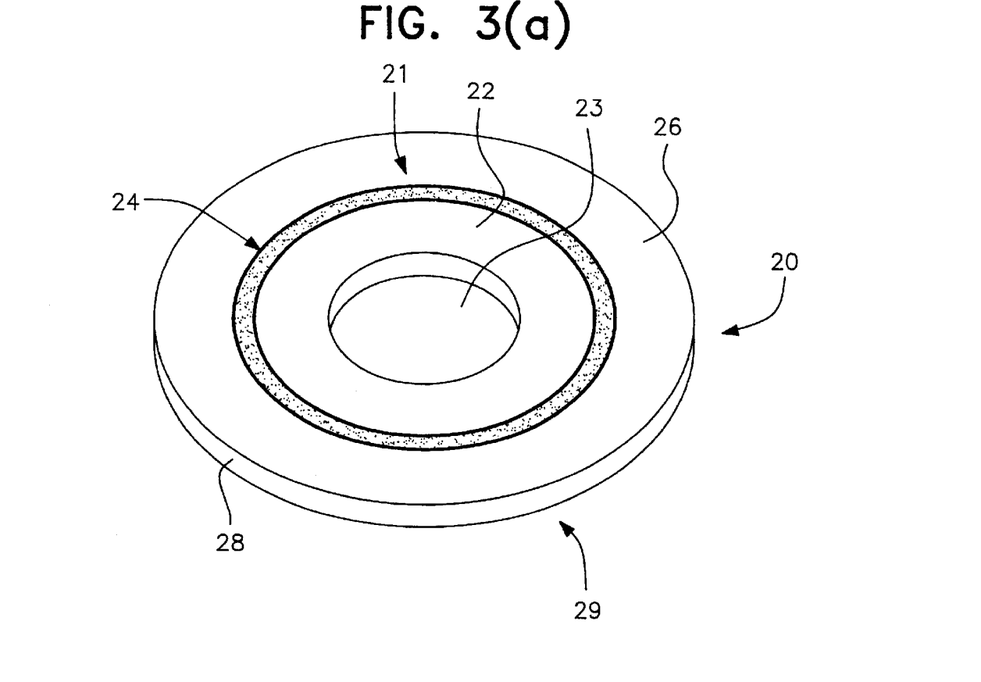
FIG. 3(a) is a perspective view and FIG. 3(b) is a side view of the preferred embodiment of the piezoelectric transformer of this invention.
Figure 3B:
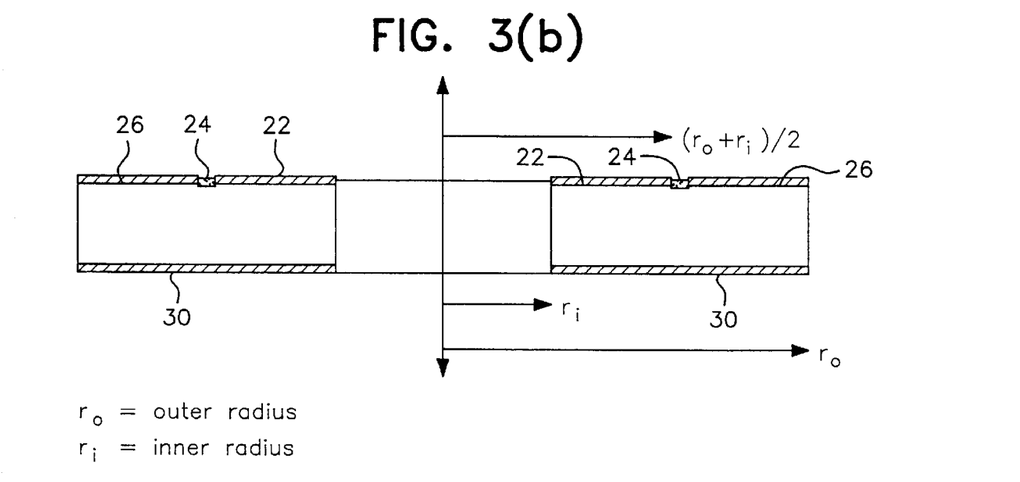

As shown in FIG. 3, the piezoelectric transformer (20) of this invention includes a substantially ring-shaped piezoelectric material. The piezoelectric transformer (20) has a first surface (29) and a second surface (21) separated by a thickness dimension (28). The second surface (21) may be divided into three electrically separated segments. The first and the second segments are each covered by corresponding first and second electrodes (26 and 22). The first and second electrodes (26 and 22) are electrically separated by a substantially ring-shaped separating segment (24).

It is not necessary for the input and output regions to be fully covered by electrodes. But using the electrode pattern shown in the figures has a good electromechanical coupling factor.

Figure 4:
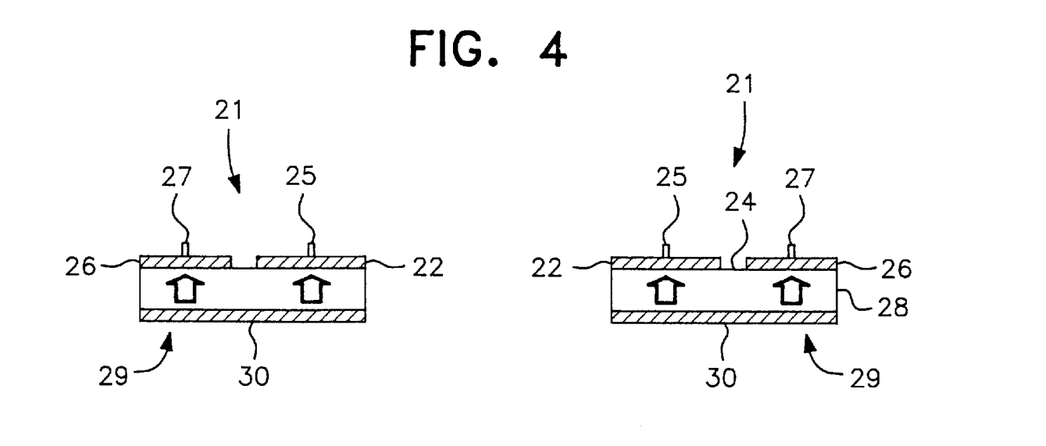

The cross sectional view of the piezoelectric transformer (20) is illustrated in FIG. 4, and the operation of the piezoelectric transformer of this invention will now be explained in detail. As shown in FIG. 4, a common electrode (30) covers the first surface (29).

The choice of piezoelectric material being used in the manufacturing of the transformer may include lead zirconate titanate (PZT), other piezoelectric ceramics and piezoelectric single crystals (e.g. $LiNbO_3$ and $LiTaO_3$), or other piezoelectric materials with high $R_{31}$ and high mechanical quality factor $Q_m$.

Figure 5:
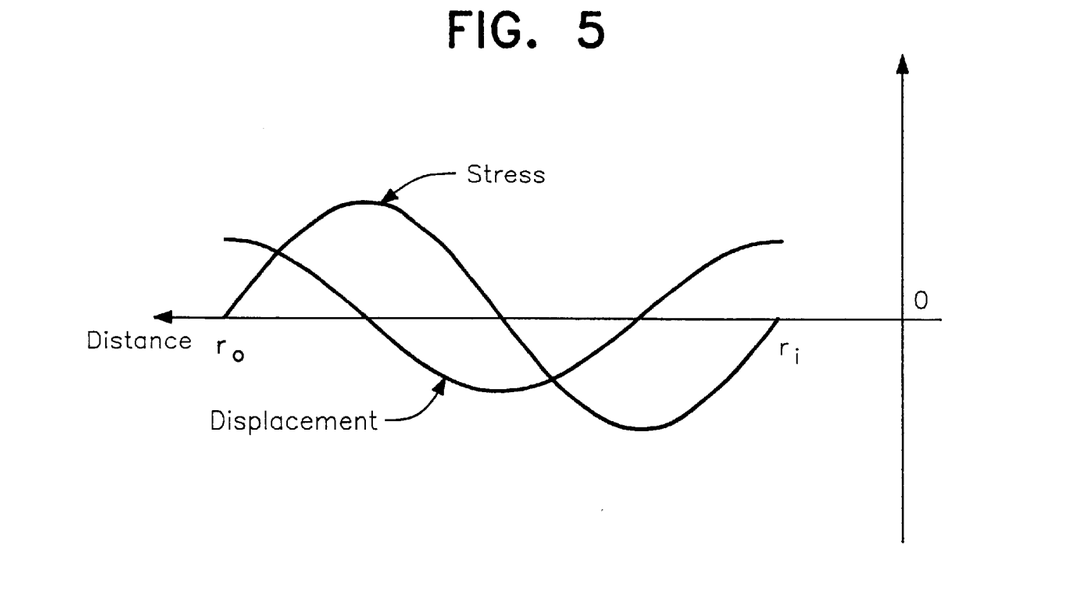
FIG. 5 shows the piezoelectric transformer of FIGS. 3(a) and (b) operating in the third symmetric extensional vibration mode and the profile of radial displacement and stress.
Figure 6A:
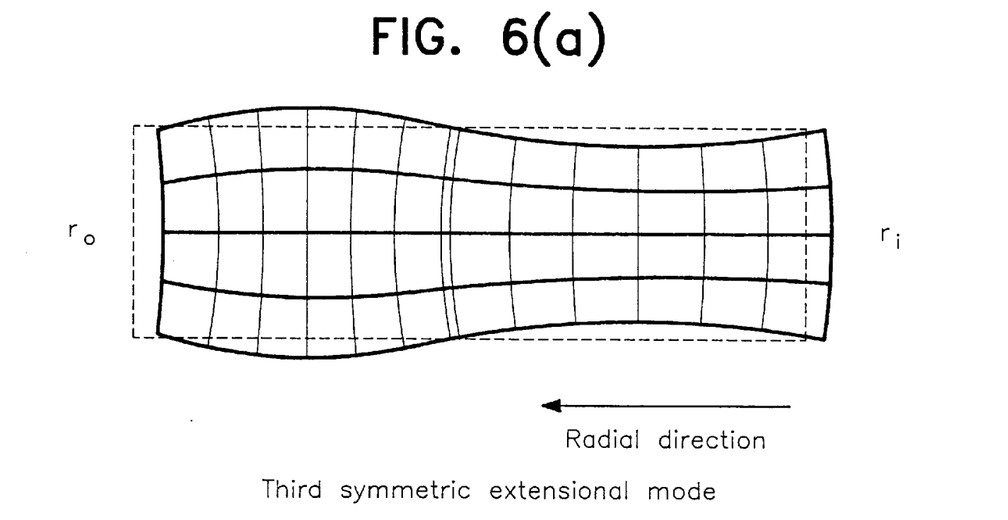
FIGS. 6(a), and 7(a), (b), (c), and (d) show the results of FEM analysis of various vibrational modes as a function of distance of a piezoelectric transformer. The centre of the transformer is on the right of the figures.
Figure 6B:
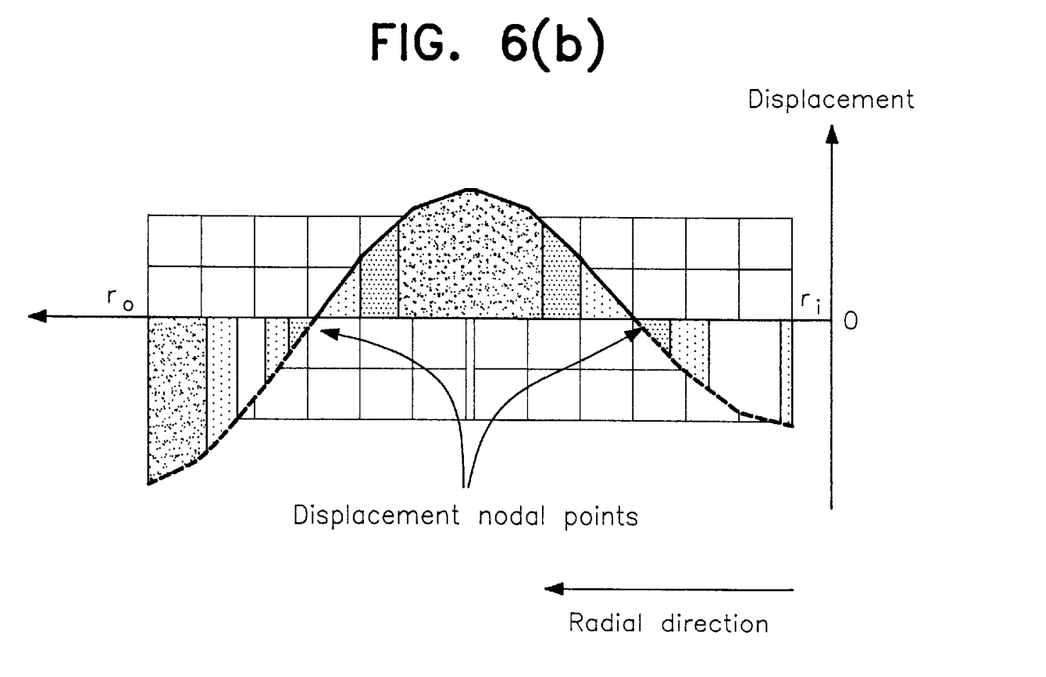
Figure 7A:
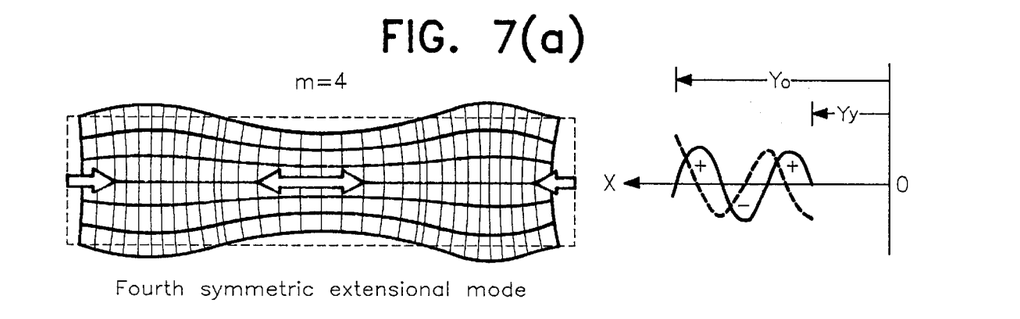
Figure 7B:
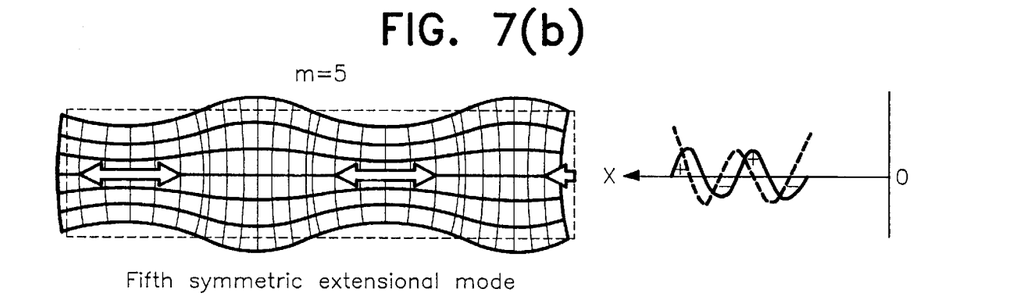
Figure 7C:
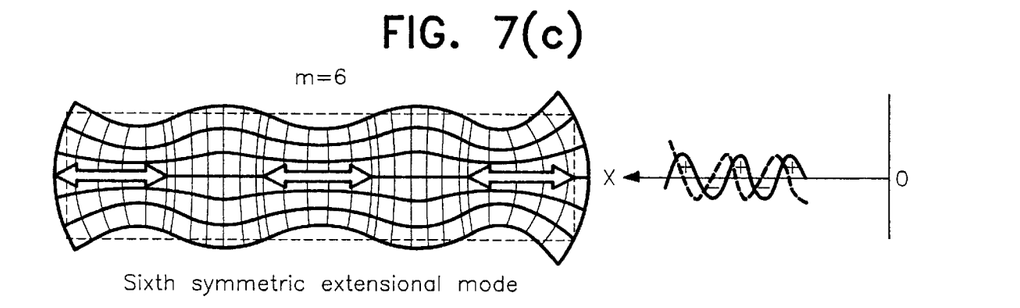
Figure 7D:
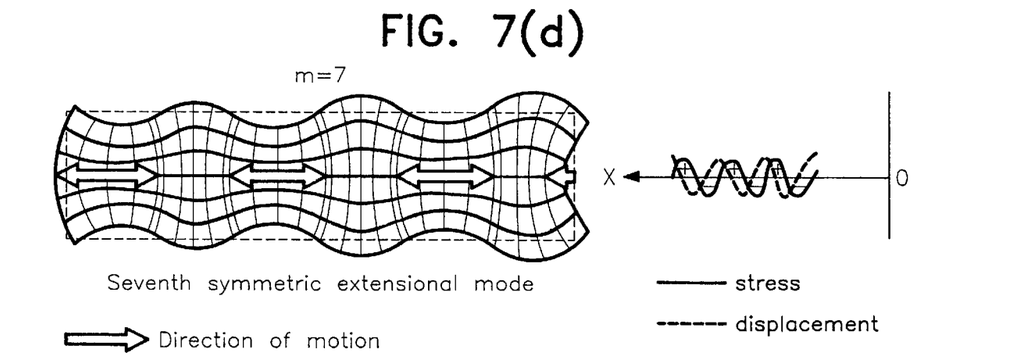

When an input signal, for example in the form of AC voltage at a certain frequency, is applied to the finest electrode (26), vibration of the piezoelectric material is excited along the radial direction. As a result, radial displacement and radial stress are developed. The radial displacement and radial stress as a function of position along the radial direction are schematically shown in FIG. 5. The third symmetric vibration mode of the piezoelectric transformer is shown schematically in FIG. 6 when the AC voltage applied is at the frequency of the third symmetric vibration mode.

The first segment being the outer ring-shaped segment is shown to be the input region while the second segment being the inner disc or ring-shaped (22) segment is the output region of the piezoelectric transformer. However, it is expressly understood that the first segment may act as the input region while the second segment is the output region.

To achieve maximum efficiency, the transformer of this invention has been designed such that the separating section (24) is located at the position where the stress is zero. Furthermore, conducting elements for applying signals to or generating signals from first and second electrodes (26 and 22) being the first and second lead wires (27 and 25), as show in FIG. 4, are soldered at the nodal points of the displacement as shown in FIG. 5.

FIG. 6 is obtained from a FEM (Finite Element Method) analysis of the vibration of the transformer showing the radial displacement as a function of position along the radial direction. It can be noted that position on the transformer where the stress is zero has a radius substantially equals to the average radius of the transformer which is equal to $$\frac{r_i + r_o}{2},$$

wherein $r_i$ and $r_o$ are the radii of the inner and outer radii of the ring, respectively. The radii are measured from the center of the ring-shaped piezoelectric transformer (20). The nodal points of displacement are substantially in the middle of the respective segments.

When an AC voltage with a frequency close to the third symmetric extensional vibration resonance is applied to the first segment, the third symmetric extensional vibration mode is excited by the $k_{31}$ converse piezoelectric effect. Then, in the second segment, an AC voltage is generated by the $k_{31}$ piezoelectric effect. The resonance frequency or the driving frequency of the $m^{th}$ symmetric extensional vibration mode $f_m$ is given by:

$$f_m = \frac{\alpha_m}{2\pi r_o} \sqrt{\frac{Y_{11}}{\rho(1-\sigma^2)}}, \quad (1)$$

$$\alpha_m \approx \frac{m-1}{1-r_i/r_o}\pi, \text{ for } m \geq 3, \quad (2)$$

where $Y_{11}$, $\rho$ and $\sigma$ are the Young's modulus, density and Poisson's ratio of the piezoelectric material, respectively. It will be shown in the example that the calculated resonance frequency agrees well with the experimental values.

In addition, transformers operate in symmetric extensional vibration modes with m bigger or equal to 4 may also be fabricated by properly designing the first and second electrodes (26 and 22). The radial displacement of the piezoelectric transformer as a function of distance of this invention in the higher order vibration modes are illustrated in FIG. 7.

Figure 8:
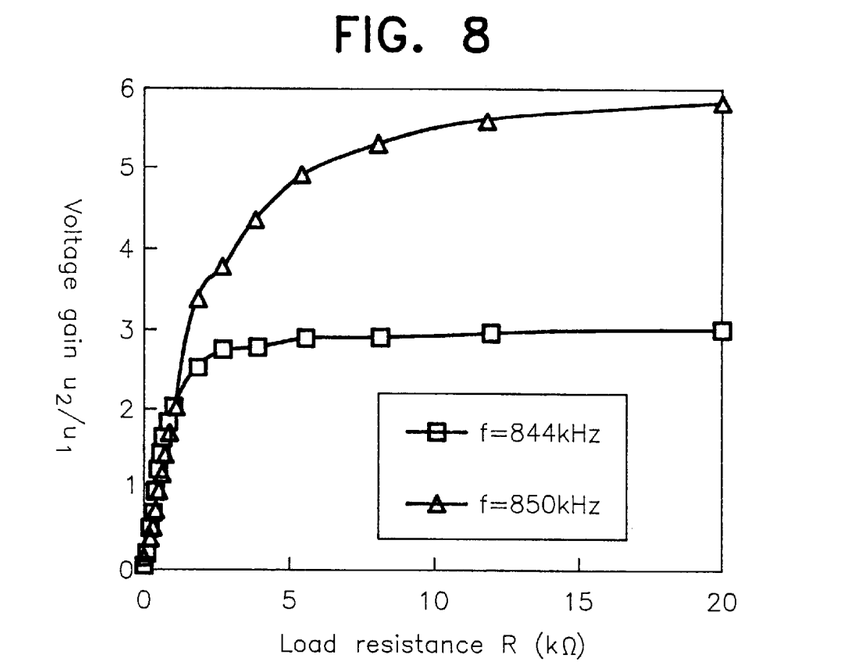
FIG. 8 shows the voltage gain versus load resistance at different driving frequencies of the piezoelectric transformer of the example.

FIG. 8 shows the voltage gain versus load resistance at different driving frequencies of the piezoelectric transformer. It can be seen that where the load resistance is small, the voltage gain increases rapidly with the load resistance. At higher load resistance, the voltage may becomes saturated and the saturated value depends on the driving frequency. Therefore, the piezoelectric transformer may work with different load resistance, and the saturated value may be altered by varying the driving frequency.

Figure 9:
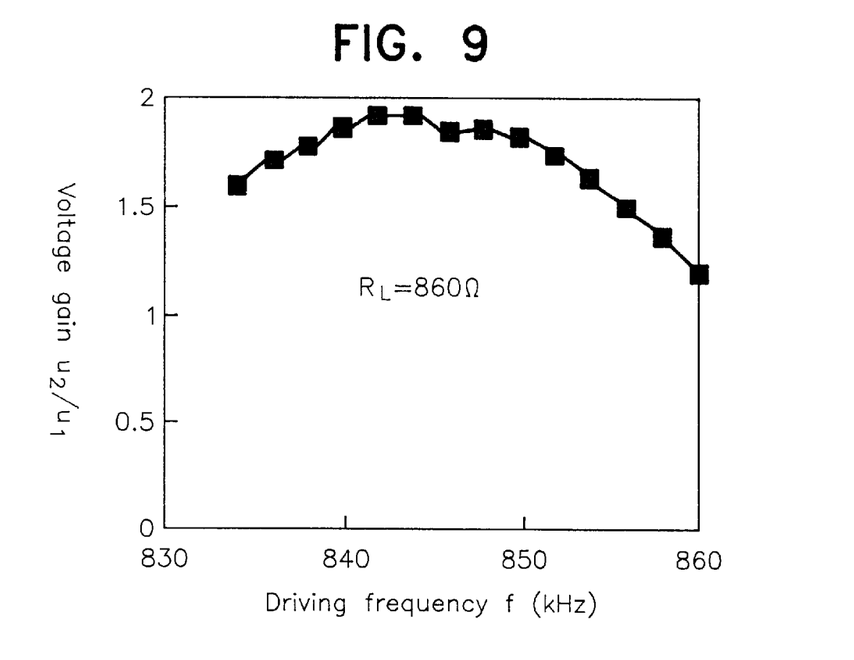
FIG. 9 shows the voltage gain versus driving frequency with a matching load at 860 Ω.

FIG. 9 shows the relationship between the output power and the efficiency with respect to driving frequency under a fixed load resistance and input voltage. It can be seen that the output power and the efficiency reaches a maximum value nearest to the calculated resonance frequency in the third symmetric extensional vibration mode in the example.

Figure 10:
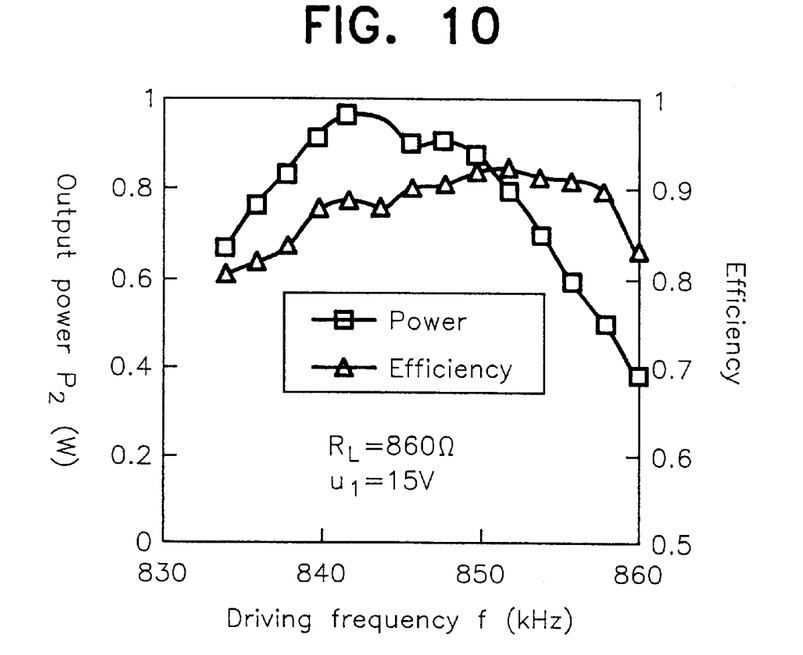
FIG. 10 shows the frequency dependence of output power and the efficiency.

FIG. 10 shows the relationship among the maximum output power, efficiency, and driving frequency. It can be seen that a high efficiency of 0.9 at a power of 1 W can be obtained.

Figure 11:
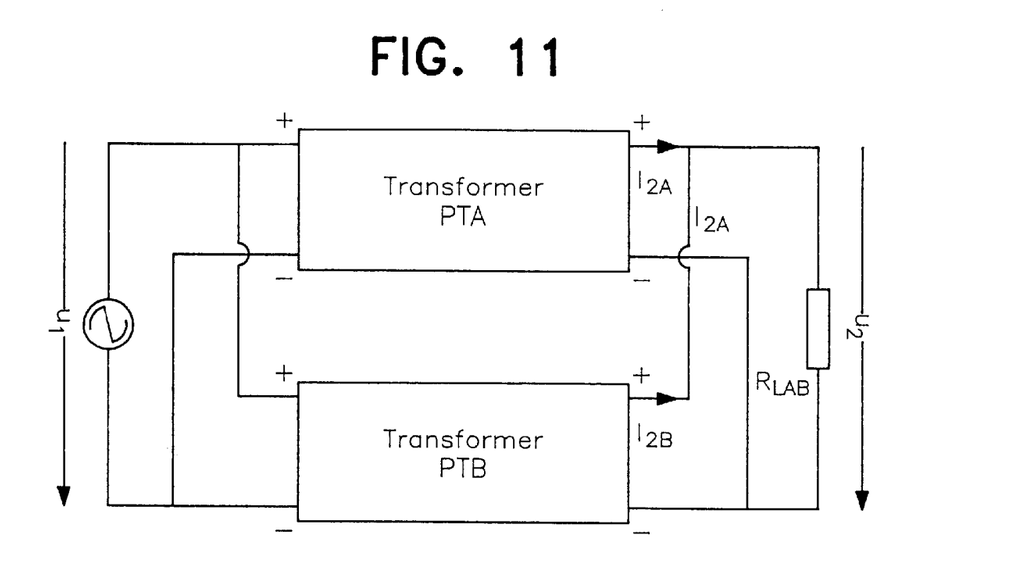
FIG. 11 shows two piezoelectric transformers of this invention operating in parallel.
Figure 12:
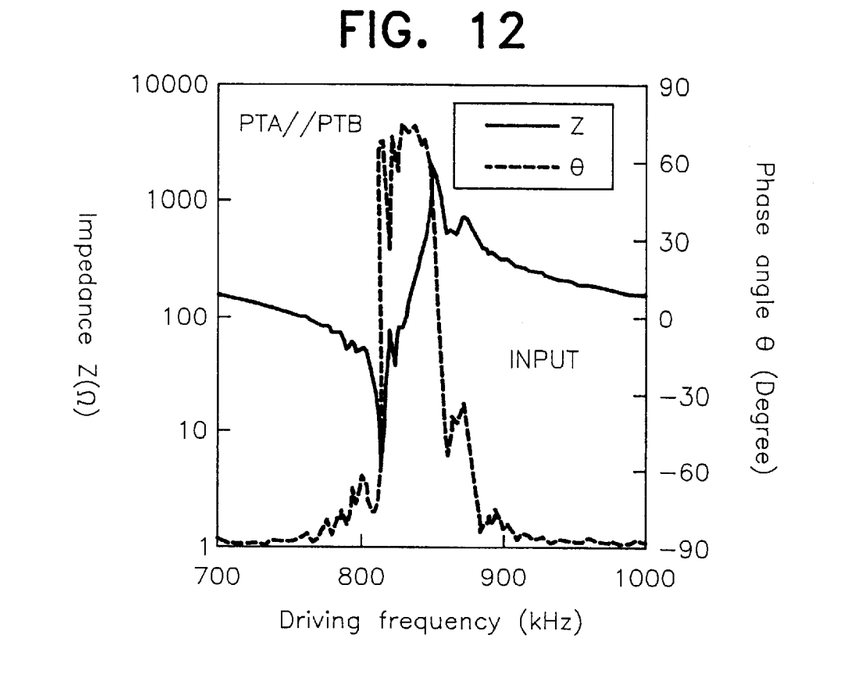
FIG. 12 shows the impedance of the input part of the parallel system of FIG. 11.

To increase the power handling capacity, two transformers of this invention are combined in parallel as shown in FIG. 11. It is well known in the art that a useful system resonance cannot be obtained in a parallel combination of a plurality of piezoelectric transformers unless such transformers have the same or nearly the same resonance and anti-resonance frequency. As the characteristics of the transformer of this invention may easily be controlled by the geometry of the transformer, this purpose may be achieved relatively easily. Indeed, the parallel combination has resulted in a useful system, in which the impedance and equivalent circuit parameters of this system are shown in FIG. 12.

Although the parallel system as shown in FIG. 11 comprises only two piezoelectric transformers of this invention, it is to be understood that the parallel system may have a plurality of piezoelectric transformers connected in parallel.

Figure 13:
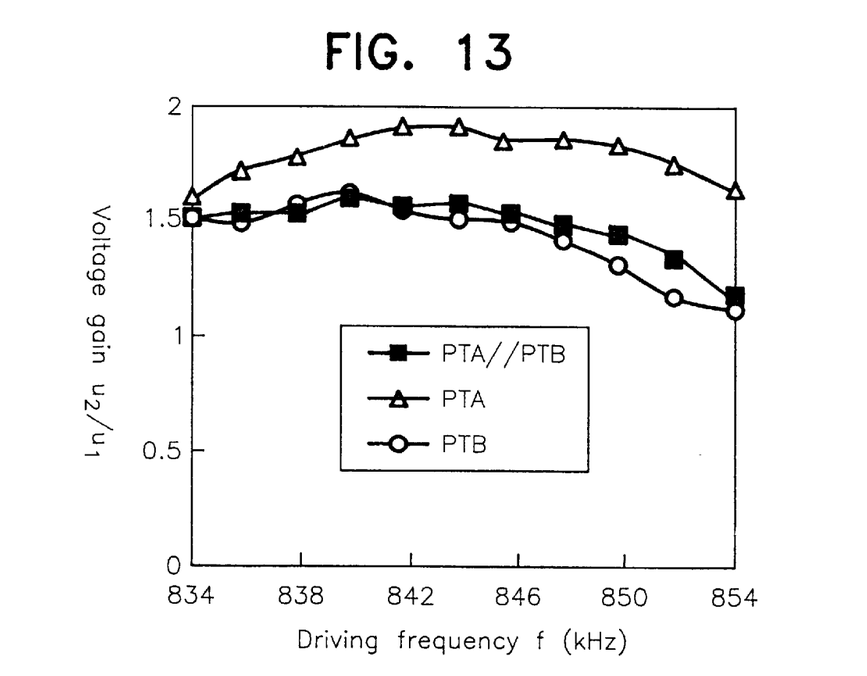
FIG. 13 shows the voltage gain versus driving frequency for the parallel system and the two individual single transformers of FIG. 11.

The relationship between the voltage gain and the driving frequency of the parallel system is shown in FIG. 13. It can be seen that the voltage gain of the parallel system is approximately equal to that of a single piezoelectric transformer with a lower voltage ratio.

Figure 14:
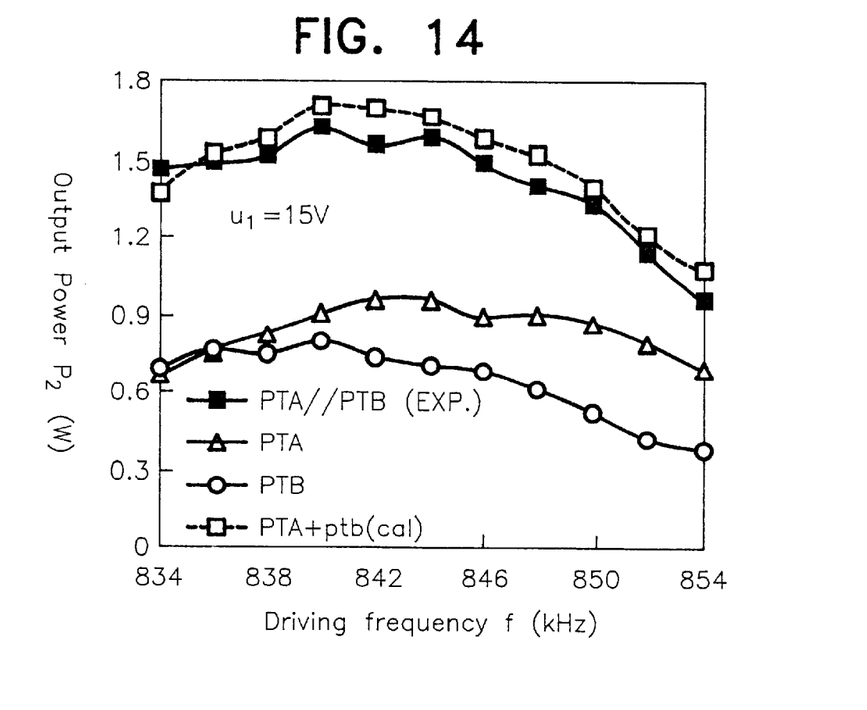
FIG. 14 shows the output power versus driving frequency for the parallel system and the two individual single transformers of FIG. 11.

FIG. 14 shows the frequency characteristics of the output power of the parallel system and the single transformer when a fixed matching load and input voltage are used. It can be seen that the measured output power of the parallel system is slightly lower than the sum of the output power of the individual transformers PTA and PTB. It may be due to the reason that although the two transformers PTA and PTB are constructed with similar parameters, there may be some subtle differences between the geometries of these two transformers.

Figure 15:
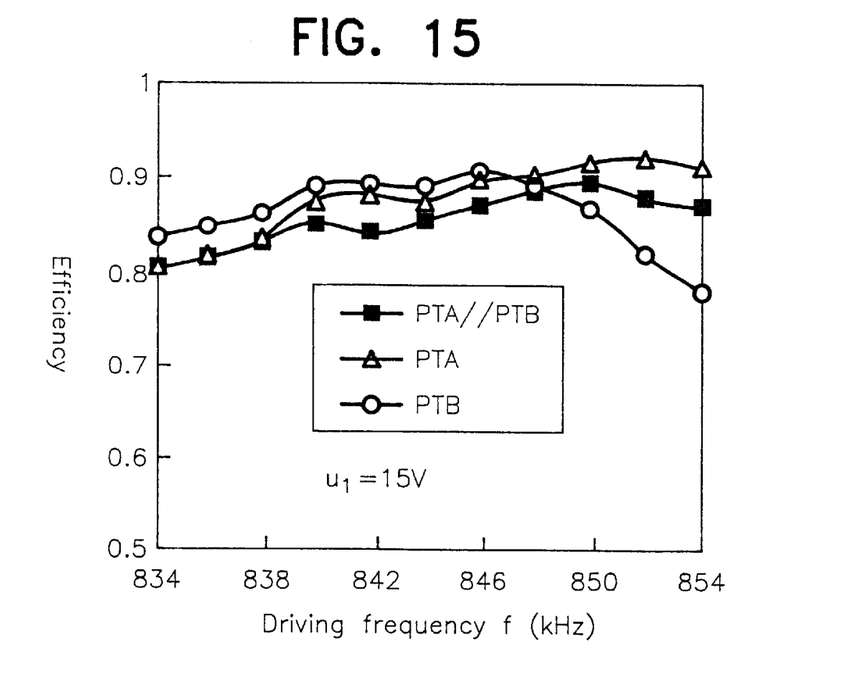
FIG. 15 shows the efficiency versus driving frequency for the parallel system and the two individual single transformers of FIG. 11.
Figure 16:
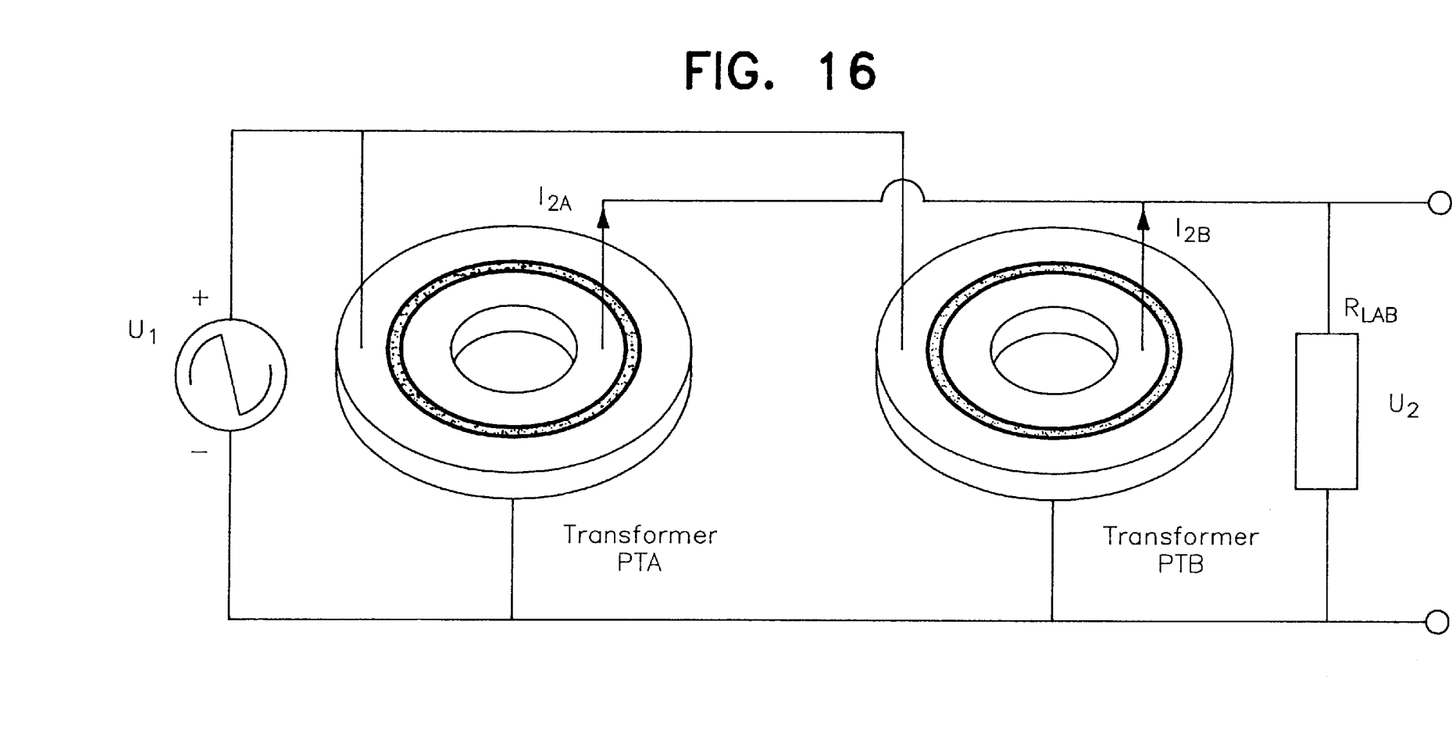
FIG. 16 shows the transformers being connected in series.

FIG. 15 shows the frequency characteristics of the efficiency of the parallel system in comparison with the individual transformers PTA and PTB. It can be seen that the efficiency of the parallel system is comparable to those of the individual systems.

The piezoelectric transformers may be connected in series. The current of the parallel transformer system is larger than that of a single transformer, while the voltage of the serial transformer system is larger than that of a single transformer.

EXAMPLE

A ring-shaped piezoelectric transformer made of PZT material has an outer diameter of 12.7 mm, and inner diameter of 5.1 mm, and thickness of 1.2 mm. The mechanical quality factor of PZT material is 2000 for this example. Relevant properties of the PZT material are shown in Table 1.

It has been calculated that the resonance frequency of the transformer in this example is 838 kHz, while the experiential value is 818 kHz.

This piezoelectric transformer was used in the experiments resting in FIGS. 8 to 10.

As discussed in the detailed description of his invention and the example, the structure of the piezoelectric transformer (20) of his invention is relatively simple when compared to those of the prior art. Therefore, the manufacturing costs may be reduced. The piezoelectric transformer (20) may also be miniaturized readily as no complicated structures are involved. Further, the piezoelectric transformers (20) may be utilized in high power application by connecting transformers in parallel.

While the preferred embodiment of this invention have been described in detail by the description and the above example, it is apparent that modifications and adaptation of the present invention will be apparent to those skill in art. It is to be expressly understood that such modifications and adaptation within the scope of the present invention as set forth in the following claims. Furthermore, it should be apparent that the embodiments of the present invention as described in forgoing paragraph shall not be interpreted to be restricted by the examples of Figures only.

List 1

| Reference Numerals | Description |
| --- | --- |
| 1 | input electrode of prior art |
| 2 | piezoelectric disc of prior art |
| 3 | output electrode of prior art |
| 4 | piezoelectric body of prior art |
| 5 | driving region of prior art |
| 6 | output region of prior art |
| 20 | piezoelectric transformer |
| 21 | second surface |
| 22 | second electrode |
| 23 | central opening |
| 24 | separating section |
| 25 | second lead wire |
| 26 | first electrode |
| 27 | first lead wire |
| 28 | thickness dimension |
| 29 | first surface |
| 30 | common electrode |

TABLE 1

RELAVANT PROPERTIES OF THE PZT MATERIAL

| $K_p$ | $Q_m$ | $d_{31}$ ($\times 10^{12}$ m/V) | $\rho$ (kg/m$^3$) | $Y^E_{11}$ ($\times 10^{10}$ N/m$^2$) | $\epsilon^T_{33}/\epsilon_0$ | $\sigma$ |
| --- | --- | --- | --- | --- | --- | --- |
| 0.59 | 2000 | −145 | 7700 | 7.2 | 1450 | 0.29 |

$K_p$ is radial electromechanical coupling factor, $Q_m$ is mechanical quality factor, $\rho$ is density, $d_{31}$ is piezoelectric charge constant, $Y^E_{11}$ is Young's modulus, $\sigma$ is Poisson's ratio, and $\epsilon^T_{33}/\epsilon_0$ is the relative permittivity.

What is claimed is:

1. A piezoelectric transformer comprising a substantially ring-shaped piezoelectric material having first and second surfaces separated by a thickness dimension defining a thickness direction, and an inner and outer radii,
   the first surface is at least partially covered by a common electrode;
   a substantially ring-shaped separating section electrically separating the first and second electrodes and having a separation radius substantially equal to an average value of the inner and outer radii;
   such that when an input electromagnetic signal is applied to the first electrode, a vibration is excited along a radial direction substantially perpendicular to the thickness direction, and a stress is developed across the radial direction, and an output electromagnetic signal is generated at the second electrode.

2. The piezoelectric transformer of claim 1, wherein the separating section is located at a position where the stress is zero.

3. The piezoelectric transformer of claim 1, wherein the first and second electrodes are in contact with conducting elements for applying to or sensing signals from the first and second electrodes, such that the conducting elements are in contact with the first and second electrodes at nodal points of the vibration displacement.

4. The piezoelectric transformer of claim 1, wherein the first and second segments each are fully covered by corresponding first and second electrodes.

5. A system for generating an output signal from an input signal including at least two connected piezoelectric transformers, wherein each piezoelectric transformer includes a substantially ring-shaped piezoelectric material having a first and second surfaces separated by a thickness dimension defining a thickness direction, and an inner and outer radii,
   the first surface is at least partially covered by a common electrode;
   the second surface includes first and second segments each at least partially covered by corresponding first and second electrodes; and
   a substantially ring-shaped separating section electrically separating the first and second electrodes and having a separating radius substantially equal to an average value of the inner and outer radii;
   such that when an input signal is applied to the first electrode, a vibration is excited along a radial direction substantially perpendicular to the thickness direction, and a stress is developed across the radial direction, and an output signal is generated at the second electrode.

6. The system of claim 5, wherein the two or more piezoelectric transformers are connected in parallel.

7. The system of claim 5, wherein the two or more piezoelectric transformers are connected in series.

* * * * *